United States Patent
Chu et al.

(10) Patent No.: US 10,522,680 B2
(45) Date of Patent: Dec. 31, 2019

(54) FINFET SEMICONDUCTOR DEVICE STRUCTURE WITH CAPPED SOURCE DRAIN STRUCTURES

(71) Applicant: Taiwan Semiconductor Manufacturing Co., Ltd., Hsinchu (TW)

(72) Inventors: Feng-Ching Chu, Pingtung County (TW); Wei-Yang Lee, Taipei (TW); Feng-Cheng Yang, Zhudong Township, Hsinchu County (TW); Yen-Ming Chen, Chupei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/692,471

(22) Filed: Aug. 31, 2017

(65) Prior Publication Data
US 2019/0067478 A1   Feb. 28, 2019

(51) Int. Cl.
*H01L 29/78* (2006.01)
*H01L 29/41* (2006.01)
*H01L 27/08* (2006.01)
*H01L 27/092* (2006.01)
*H01L 29/06* (2006.01)
*H01L 29/08* (2006.01)
(Continued)

(52) U.S. Cl.
CPC .. *H01L 29/7848* (2013.01); *H01L 21/823814* (2013.01); *H01L 21/823821* (2013.01); *H01L 21/823871* (2013.01); *H01L 21/823878* (2013.01); *H01L 23/535* (2013.01); *H01L 27/0924* (2013.01); *H01L 29/0653* (2013.01); *H01L 29/0847* (2013.01); *H01L 29/161* (2013.01); *H01L 29/165* (2013.01); *H01L 29/167* (2013.01); *H01L 29/24* (2013.01); *H01L 29/267* (2013.01); *H01L 27/0886* (2013.01); *H01L 29/41791* (2013.01); *H01L 29/7851* (2013.01)

(58) Field of Classification Search
CPC ........... H01L 29/7851; H01L 29/41791; H01L 27/0886; H01L 27/0924
See application file for complete search history.

(56) References Cited

U.S. PATENT DOCUMENTS 8,796,666 B1   8/2014 Huang et al.
8,815,712 B2   8/2014 Wan et al.
(Continued)

*Primary Examiner* — Ida M Soward
(74) *Attorney, Agent, or Firm* — Birch, Stewart, Kolasch & Birch, LLP

(57) ABSTRACT

A semiconductor device structure is provided. The semiconductor device structure includes a substrate having a base and a first fin structure over the base. The semiconductor device structure includes an isolation layer over the base. The first fin structure is partially in the isolation layer. The semiconductor device structure includes a first gate structure over and across the first fin structure. The semiconductor device structure includes a first source structure and a first drain structure on the first fin structure and on two opposite sides of the first gate structure. The first source structure and the first drain structure are made of an N-type conductivity material. The semiconductor device structure includes a cap layer covering the first source structure and the first drain structure. The cap layer is doped with a Group IIIA element.

20 Claims, 20 Drawing Sheets

(51) Int. Cl.
  *H01L 29/161* (2006.01)
  *H01L 29/165* (2006.01)
  *H01L 29/24* (2006.01)
  *H01L 29/267* (2006.01)
  *H01L 29/167* (2006.01)
  *H01L 23/535* (2006.01)
  *H01L 21/8238* (2006.01)
  *H01L 27/088* (2006.01)
  *H01L 29/417* (2006.01)

(56) References Cited

U.S. PATENT DOCUMENTS

| | | | |
|---|---|---|---|
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,252,271 B2 * | 2/2016 | Lu | H01L 29/66795 |
| 9,362,403 B2 * | 6/2016 | Xie | H01L 29/785 |
| 9,397,098 B2 * | 7/2016 | Lin | H01L 21/823431 |
| 9,397,102 B2 * | 7/2016 | Glass | H01L 29/0847 |
| 9,443,757 B1 * | 9/2016 | Tsai | H01L 21/76829 |
| 9,450,094 B1 * | 9/2016 | Yeh | H01L 29/7848 |
| 9,472,613 B2 * | 10/2016 | Cappellani | H01L 21/76 |
| 9,496,402 B2 * | 11/2016 | Fang | H01L 29/7851 |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,627,375 B2 * | 4/2017 | Chang | H01L 21/823431 |
| 9,905,670 B2 * | 2/2018 | Lin | H01L 29/665 |
| 9,997,631 B2 * | 6/2018 | Yang | H01L 21/31111 |
| 10,026,838 B2 * | 7/2018 | Wu | H01L 29/7848 |
| 10,103,249 B2 * | 10/2018 | Lee | H01L 29/66795 |
| 10,170,370 B2 * | 1/2019 | Cheng | H01L 21/0262 |
| 2009/0026505 A1 * | 1/2009 | Okano | H01L 29/66795 257/255 |
| 2013/0295738 A1 * | 11/2013 | Kuo | H01L 29/66795 438/283 |
| 2014/0273369 A1 * | 9/2014 | Wei | H01L 21/823821 438/232 |
| 2015/0340468 A1 * | 11/2015 | Lim | H01L 29/66795 438/283 |
| 2016/0020294 A1 * | 1/2016 | Koo | H01L 29/511 257/288 |
| 2016/0043170 A1 * | 2/2016 | Park | H01L 27/0886 257/369 |
| 2016/0087053 A1 * | 3/2016 | Kim | H01L 29/41783 257/369 |
| 2016/0284700 A1 * | 9/2016 | Yoon | H01L 27/0886 |
| 2016/0284806 A1 * | 9/2016 | Park | H01L 29/41791 |
| 2016/0322498 A1 * | 11/2016 | Chang | H01L 27/0924 |
| 2016/0329431 A1 * | 11/2016 | Glass | H01L 29/0847 |
| 2016/0336450 A1 * | 11/2016 | Tak | H01L 29/7851 |
| 2017/0125410 A1 * | 5/2017 | Li | H01L 21/823431 |
| 2017/0125552 A1 * | 5/2017 | Tung | H01L 29/66795 |
| 2017/0179120 A1 * | 6/2017 | Cheng | H01L 21/823431 |
| 2017/0221724 A1 * | 8/2017 | Murthy | H01L 21/6719 |
| 2017/0243791 A1 * | 8/2017 | Jacob | H01L 21/823814 |
| 2017/0271462 A1 * | 9/2017 | Kim | H01L 29/41783 |
| 2017/0288041 A1 * | 10/2017 | Pandey | H01L 29/66795 |
| 2018/0175046 A1 * | 6/2018 | Chiou | H01L 27/1104 |
| 2018/0197861 A1 * | 7/2018 | Park | H01L 27/0924 |
| 2018/0315830 A1 * | 11/2018 | Hsieh | H01L 29/66545 |
| 2019/0067131 A1 * | 2/2019 | Liaw | H01L 21/76816 |
| 2019/0097039 A1 * | 3/2019 | Huang | H01L 23/485 |

\* cited by examiner

US 10,522,680 B2

FINFET SEMICONDUCTOR DEVICE STRUCTURE WITH CAPPED SOURCE DRAIN STRUCTURES

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease (e.g., the distance between two adjacent fin structures continues to decrease), fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1N-1 is a cross-sectional view illustrating the semiconductor device structure along a sectional line I-I' in FIG. 1N, in accordance with some embodiments.

FIG. 1N-2 is a cross-sectional view illustrating the semiconductor device structure along a sectional line II-II' in FIG. 1N, in accordance with some embodiments.

FIG. 1N-3 is a cross-sectional view illustrating the semiconductor device structure along a sectional line III-III' in FIG. 1N, in accordance with some embodiments.

FIG. 1N-4 is a cross-sectional view illustrating the semiconductor device structure along a sectional line IV-IV' in FIG. 1N, in accordance with some embodiments.

FIG. 1N-5 is a cross-sectional view illustrating the semiconductor device structure along a sectional line V-V' in FIG. 1N, in accordance with some embodiments.

DETAILED DESCRIPTION

Figure 1A:
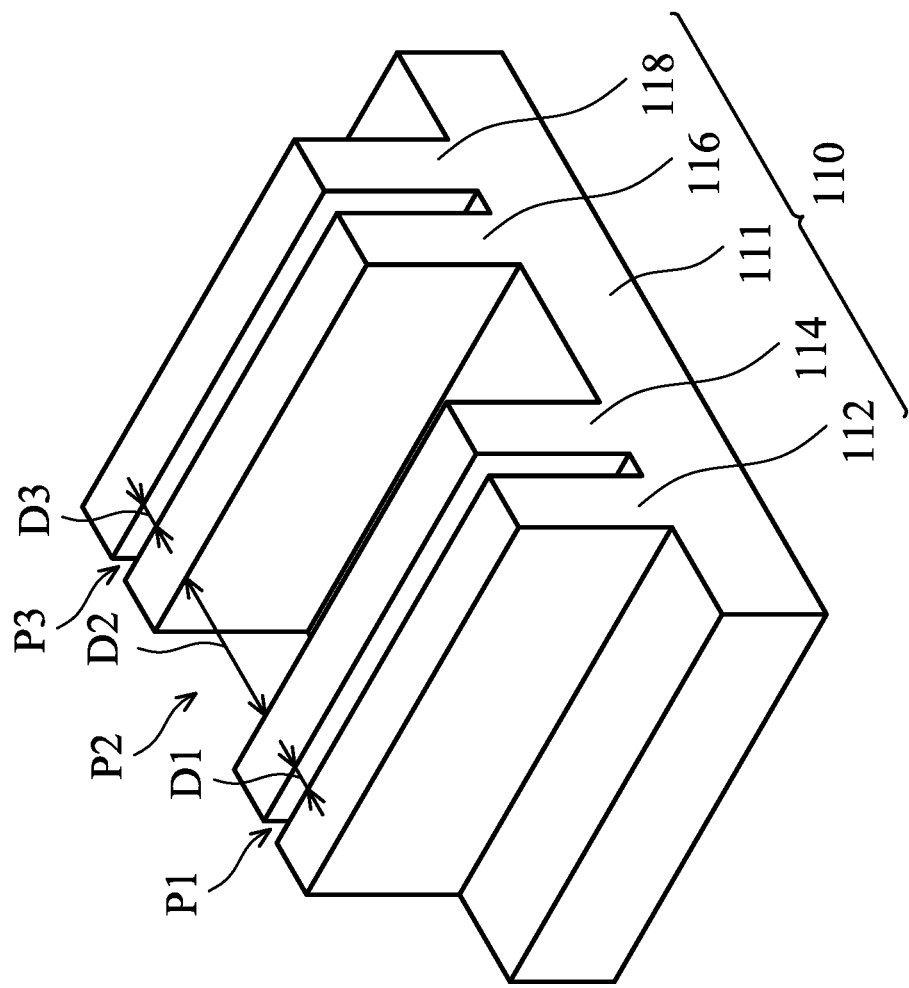
FIGS. 1A-1N are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
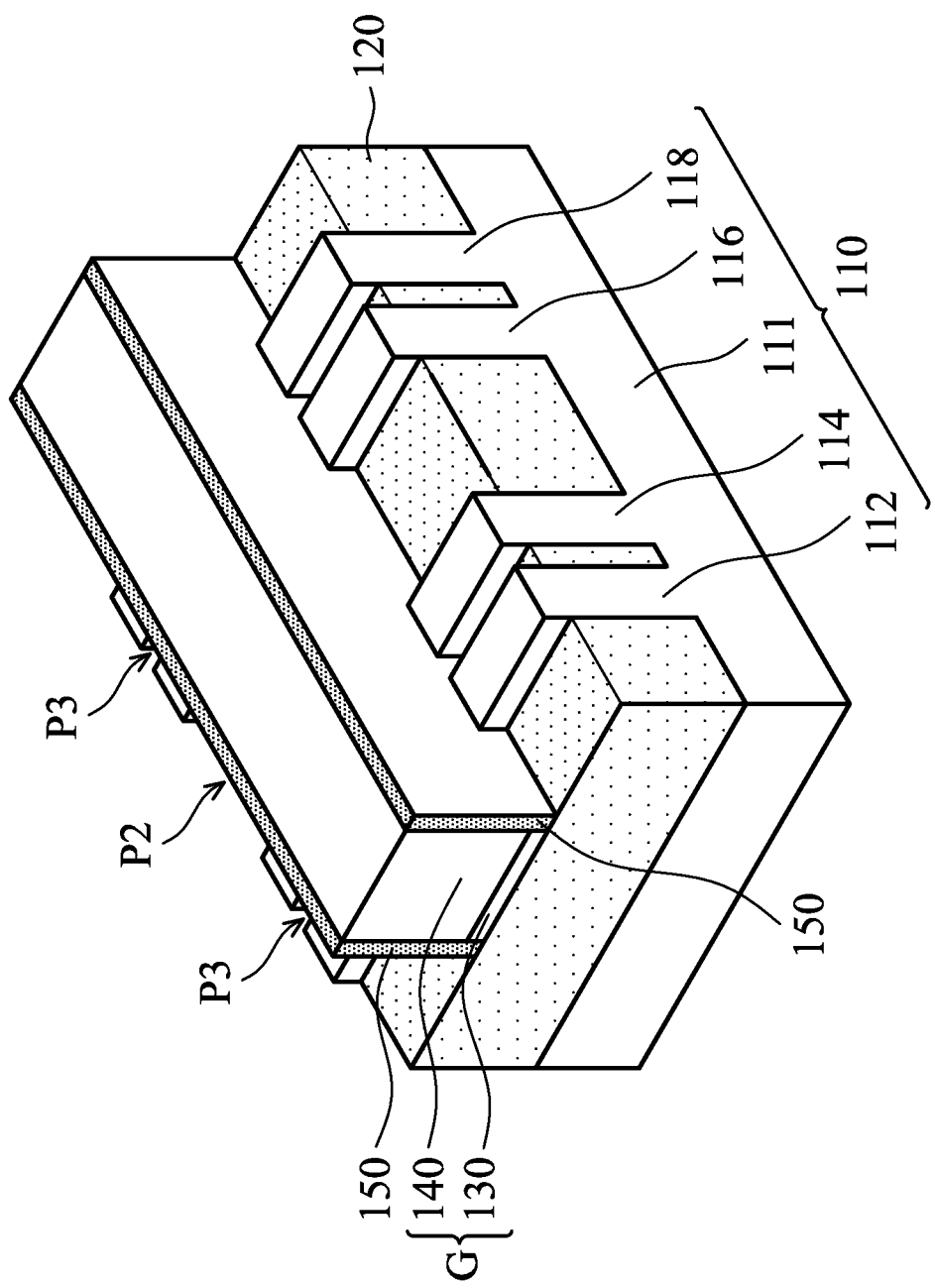
FIG. 1K-1 is a cross-sectional view illustrating the semiconductor device structure along a sectional line I-I' in FIG. 1K, in accordance with some embodiments.
Figure 1C:
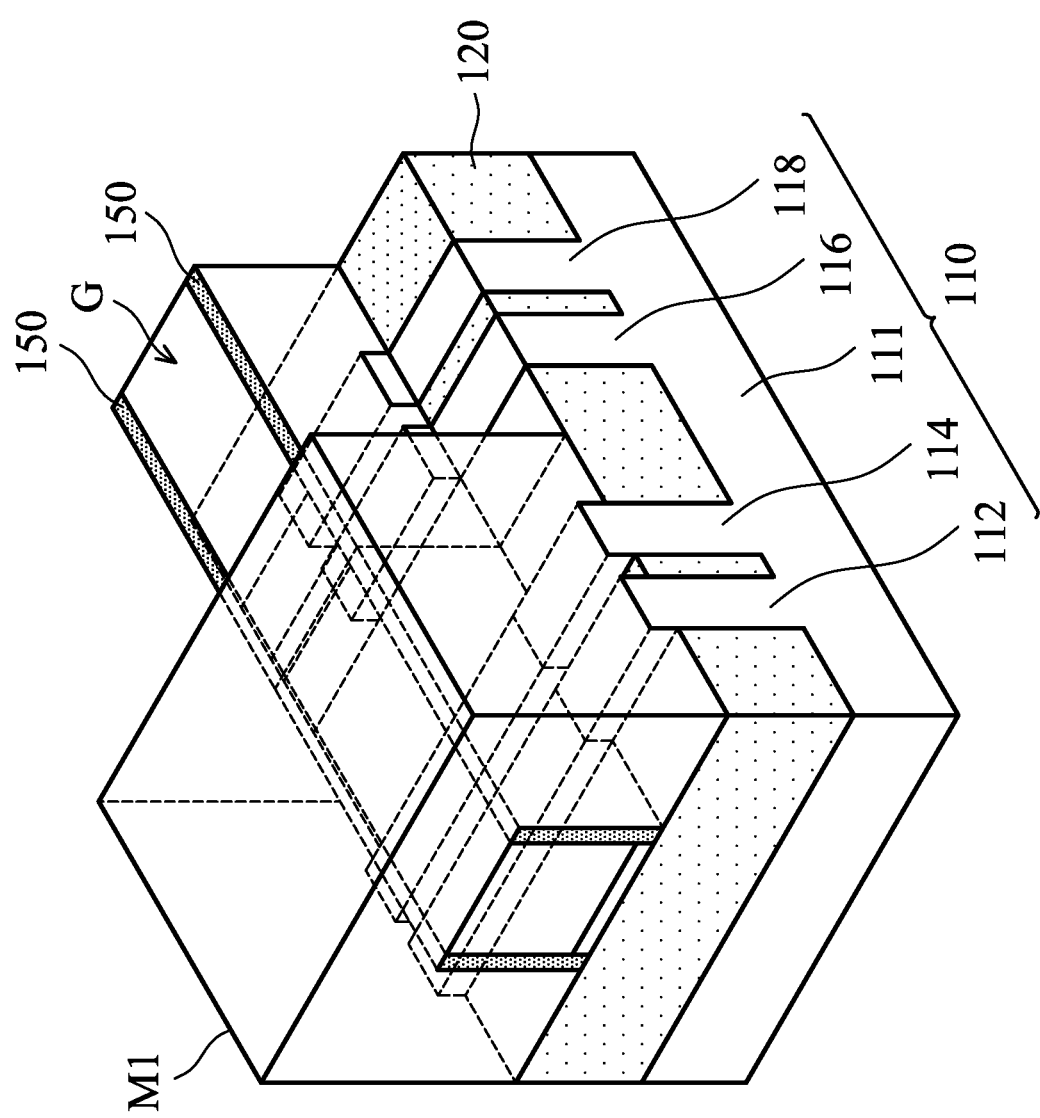
Figure 1D:
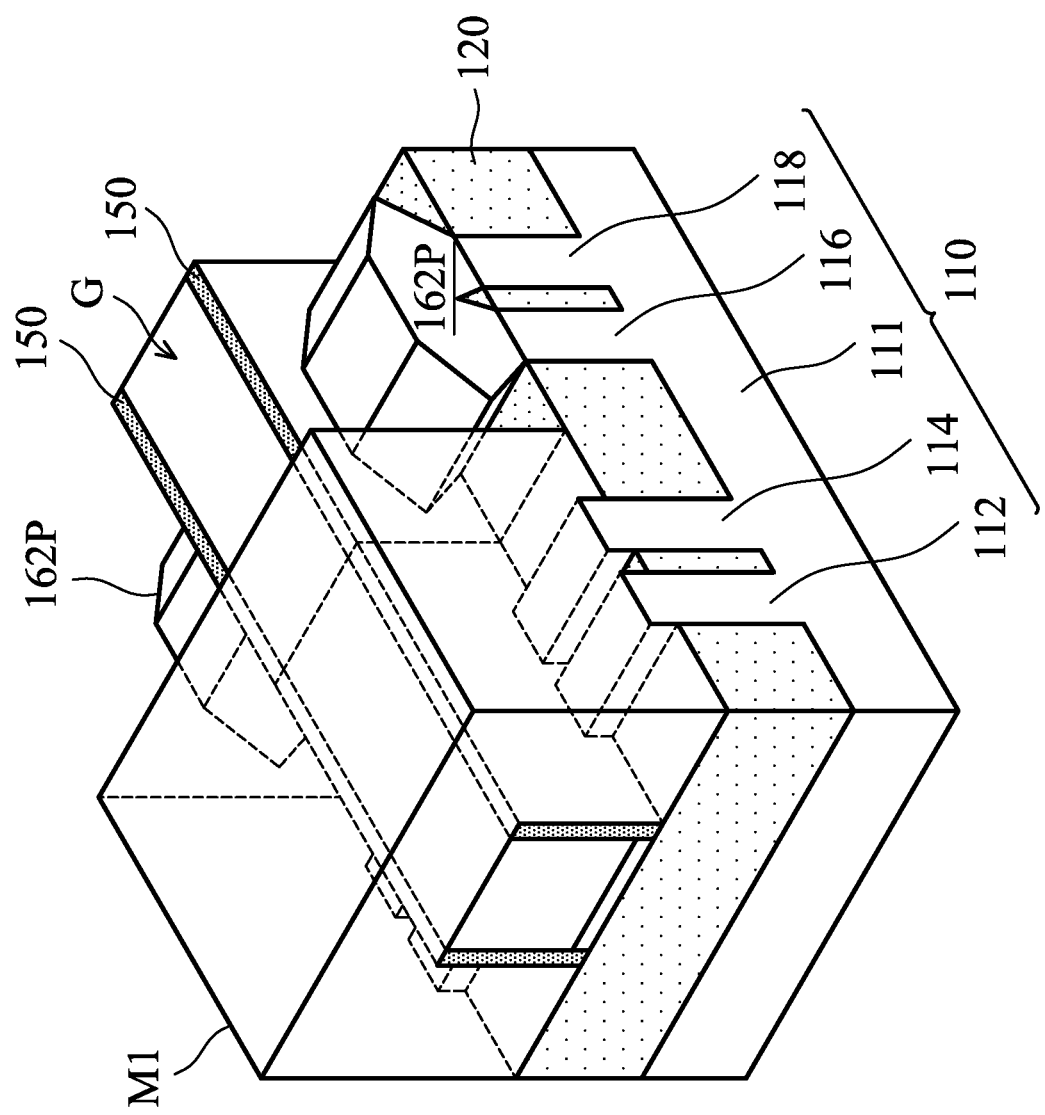
Figure 1E:
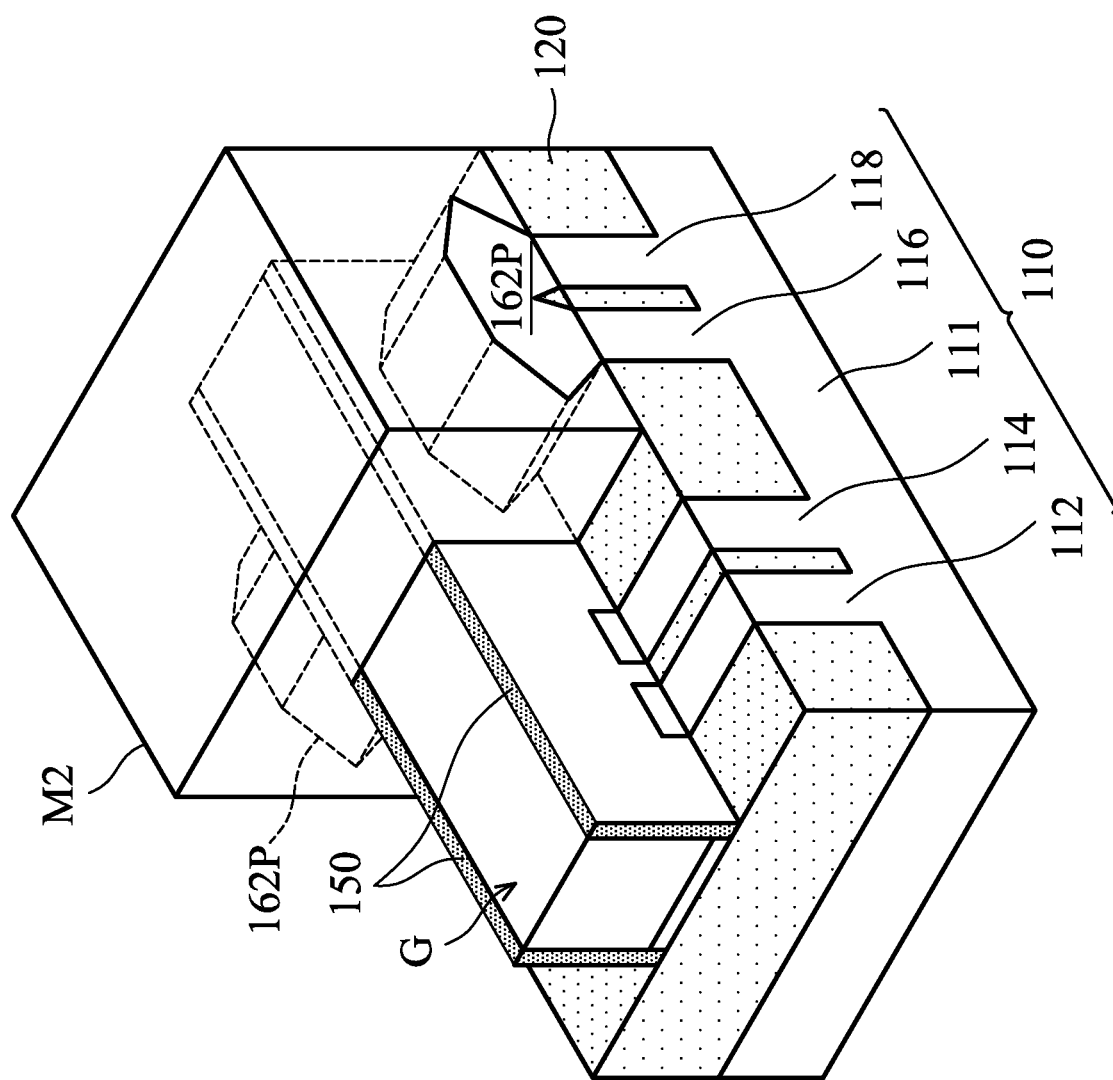
Figure 1F:
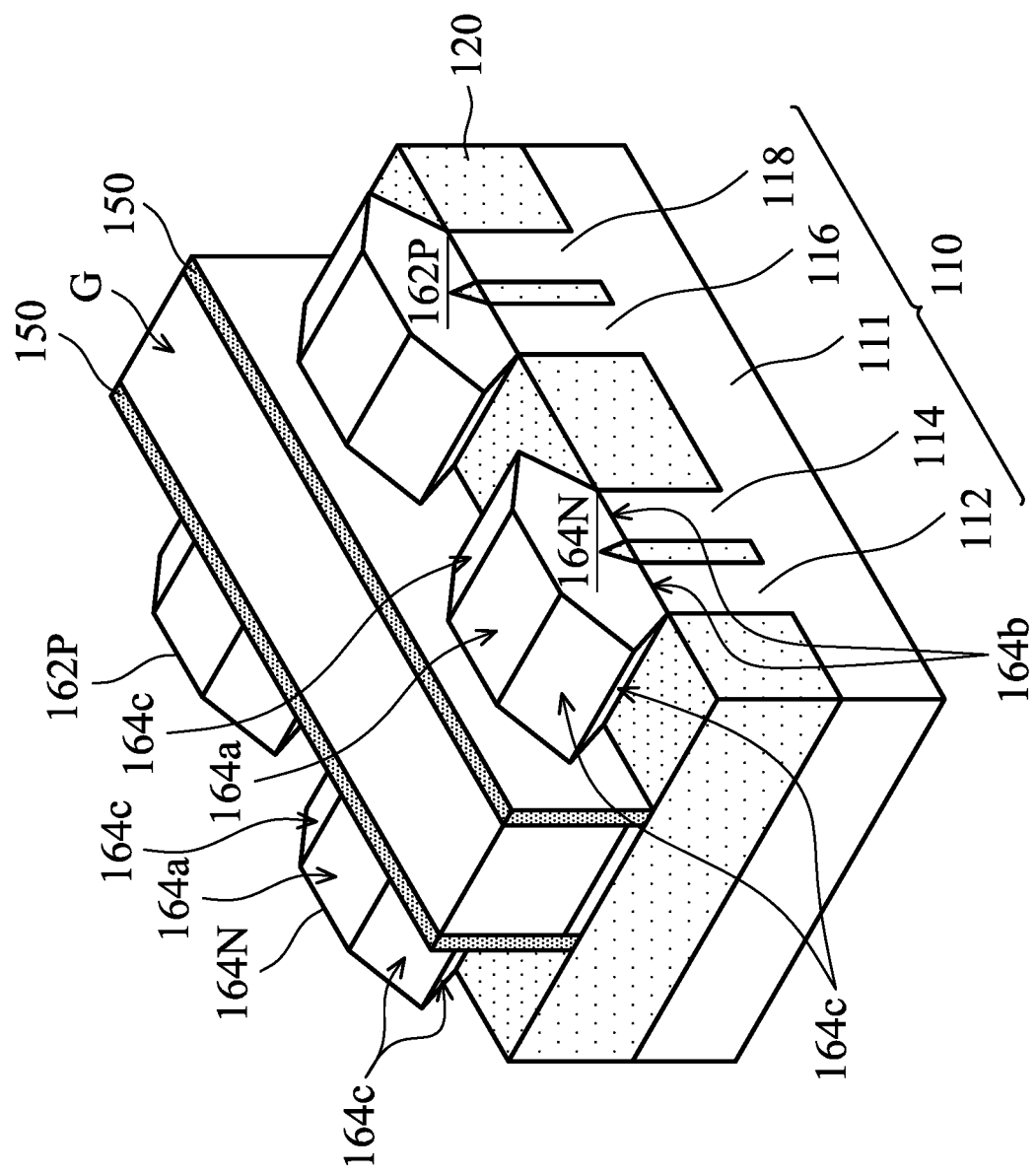
Figure 1G:
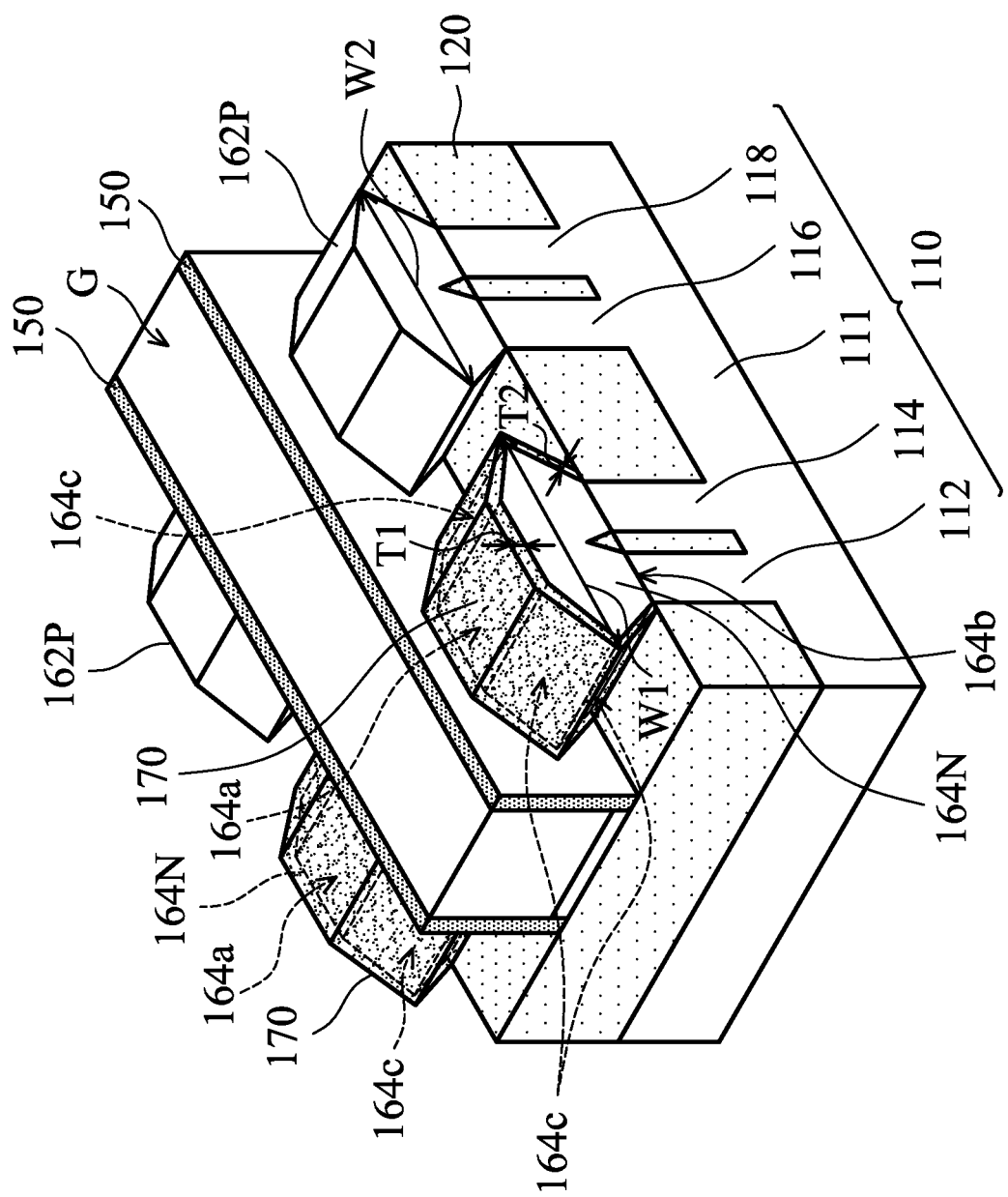
Figure 1H:
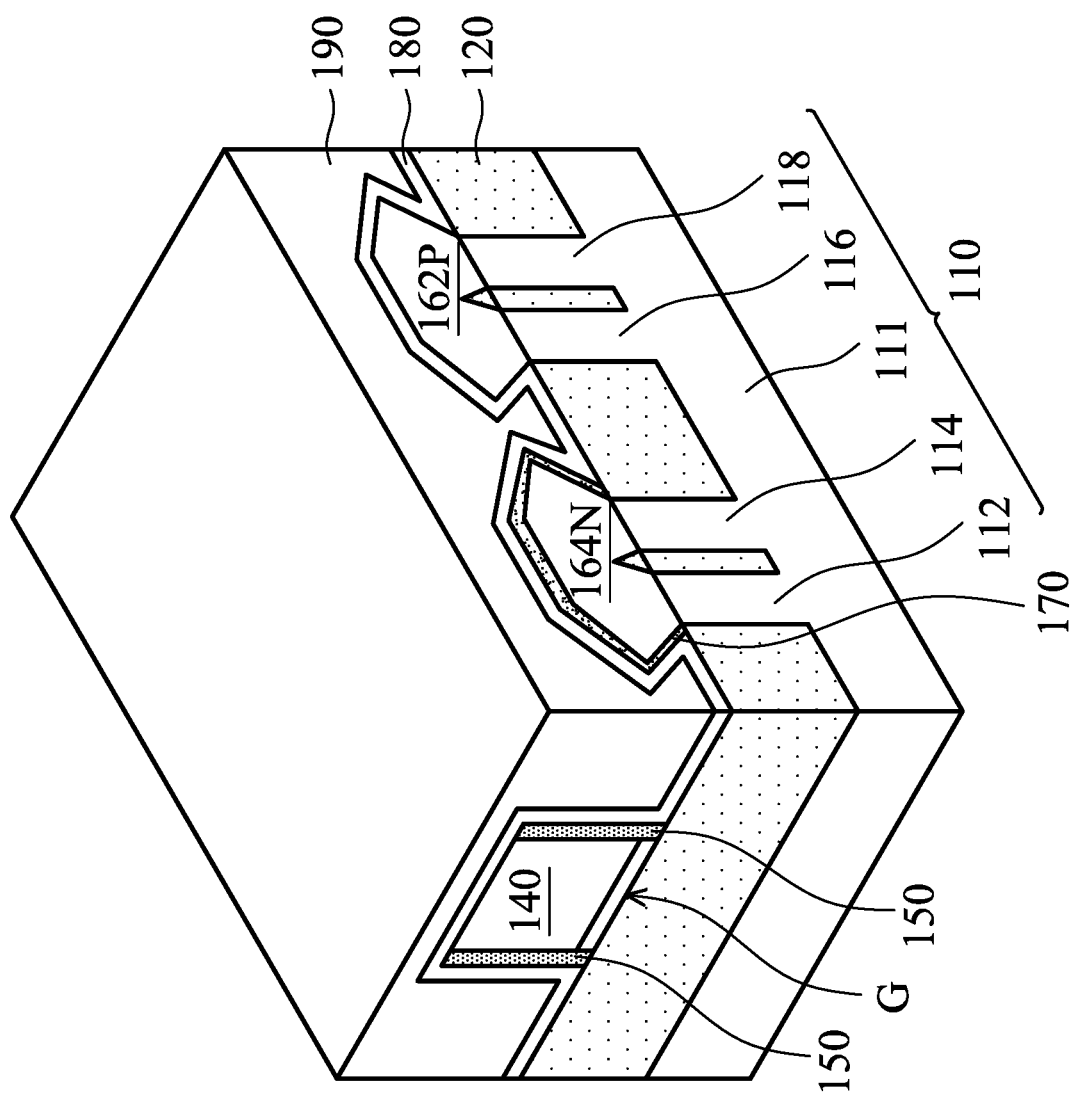
Figure 1I:
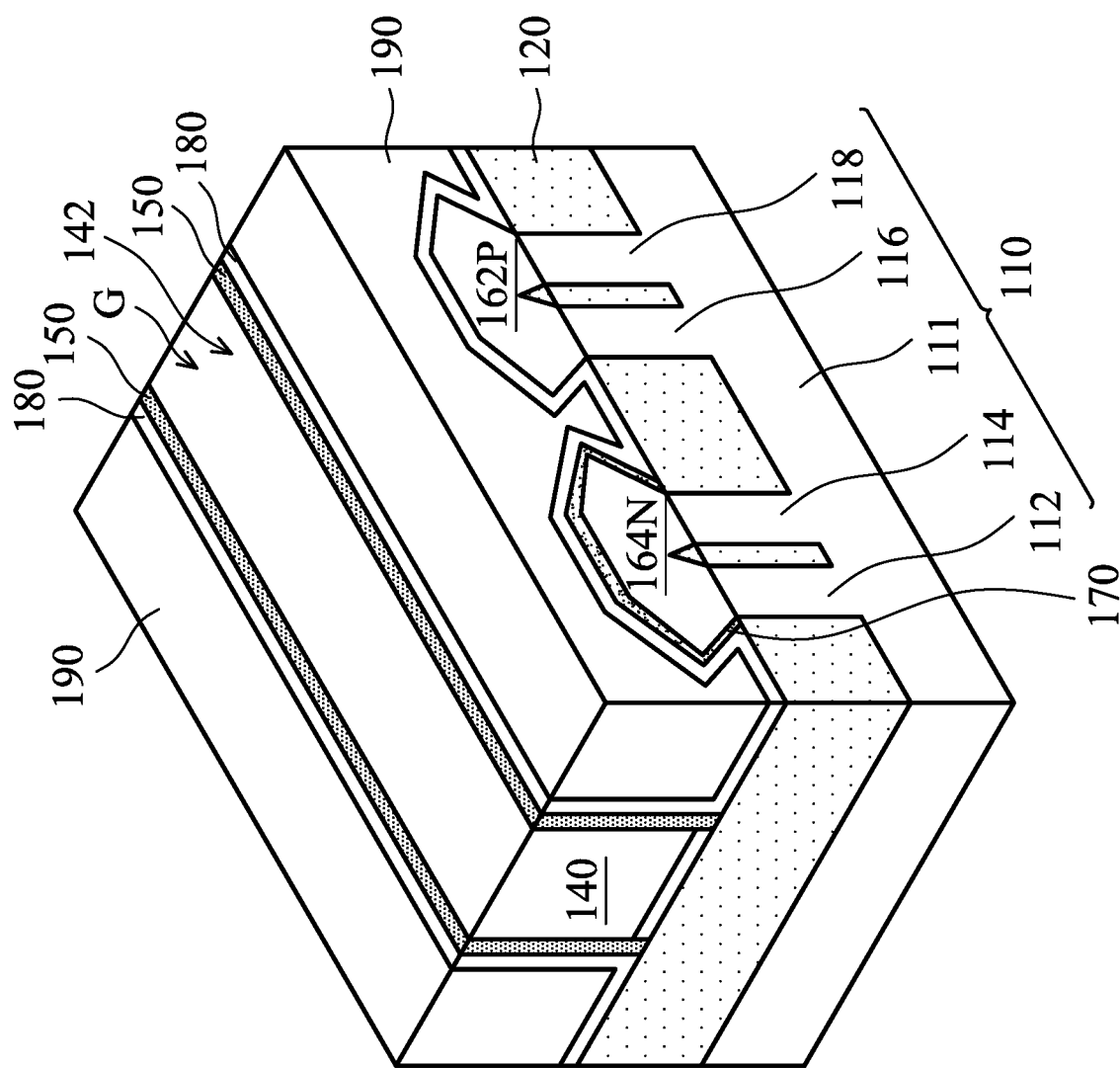
Figure 1J:
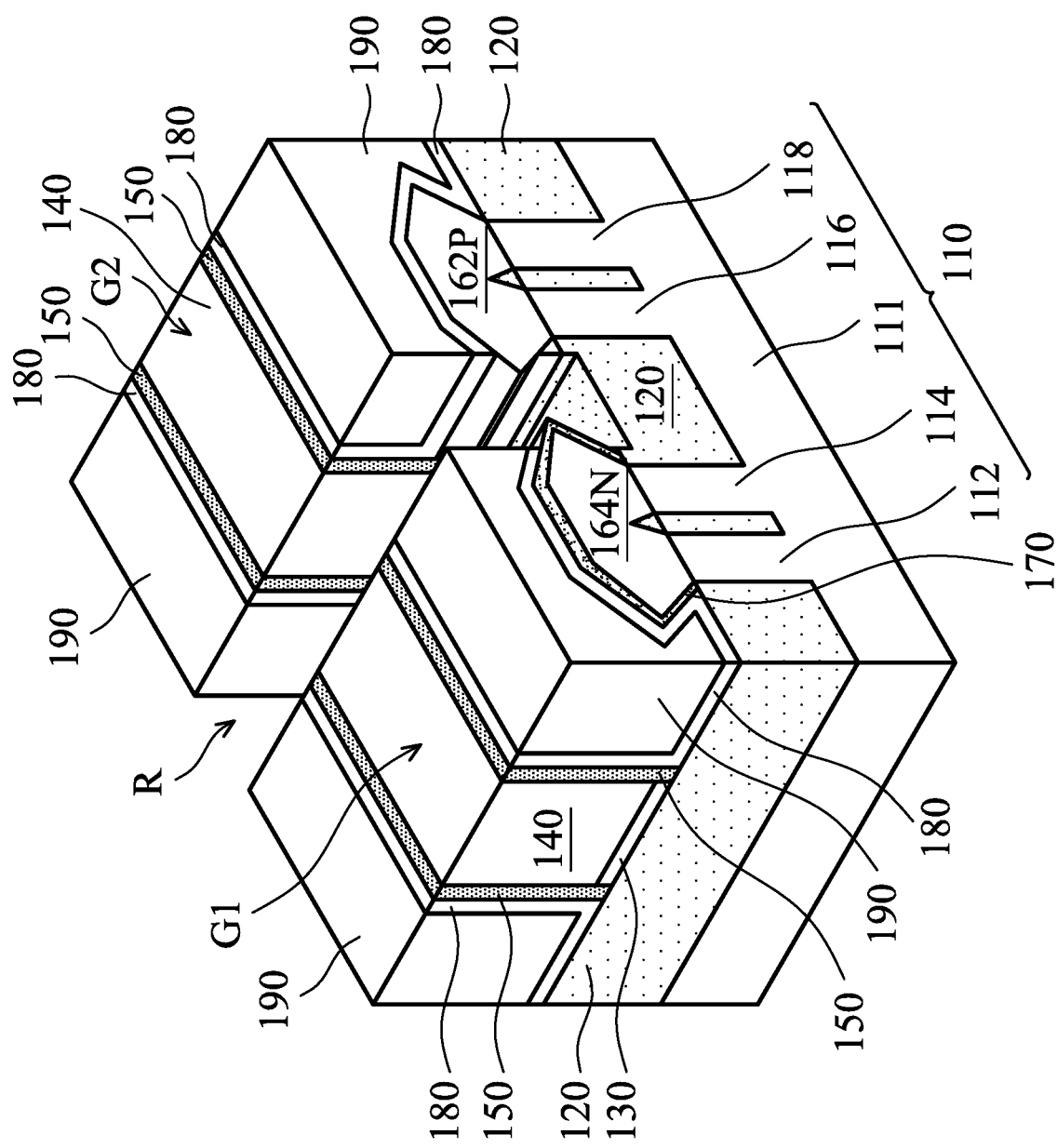
Figure 1K:
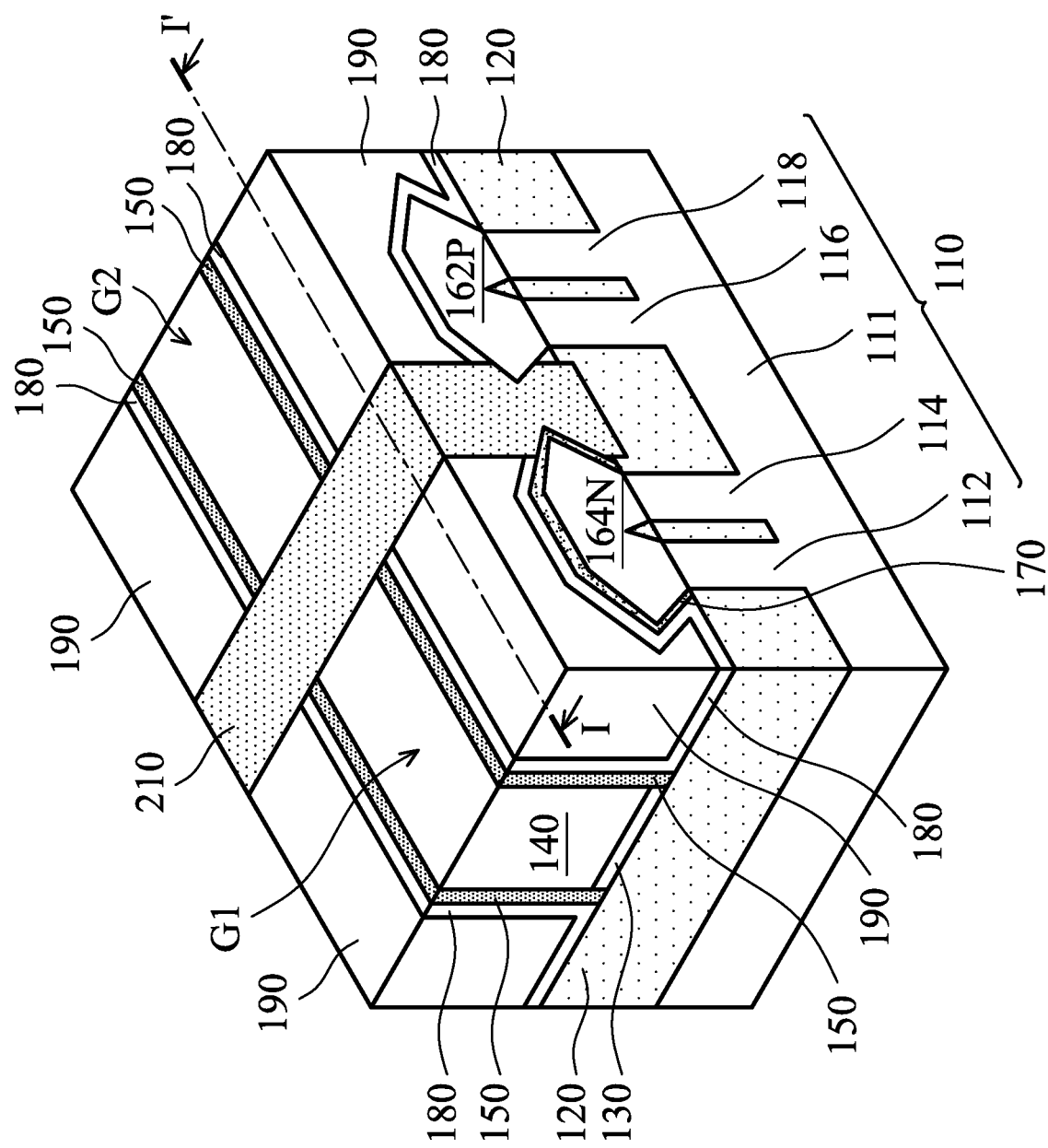
Figures 1, 1K:
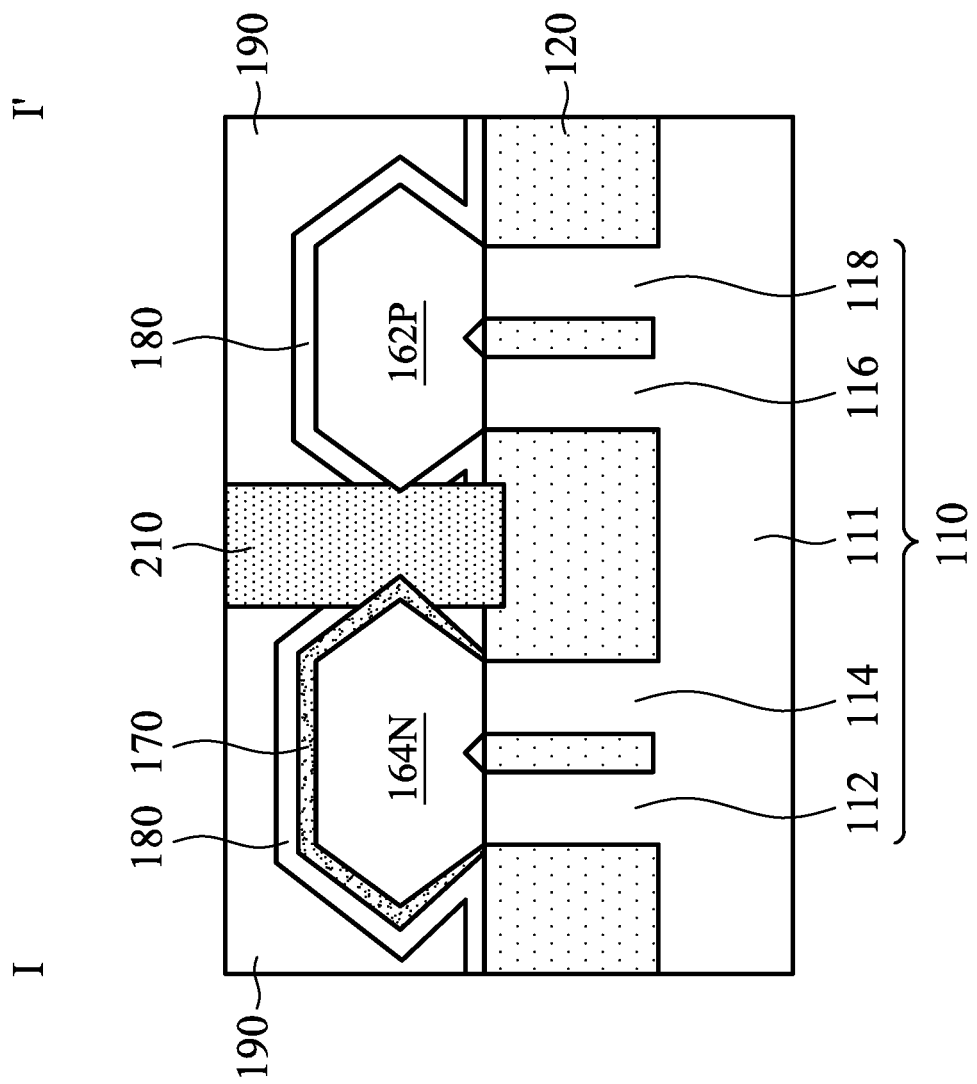
Figure 1L:
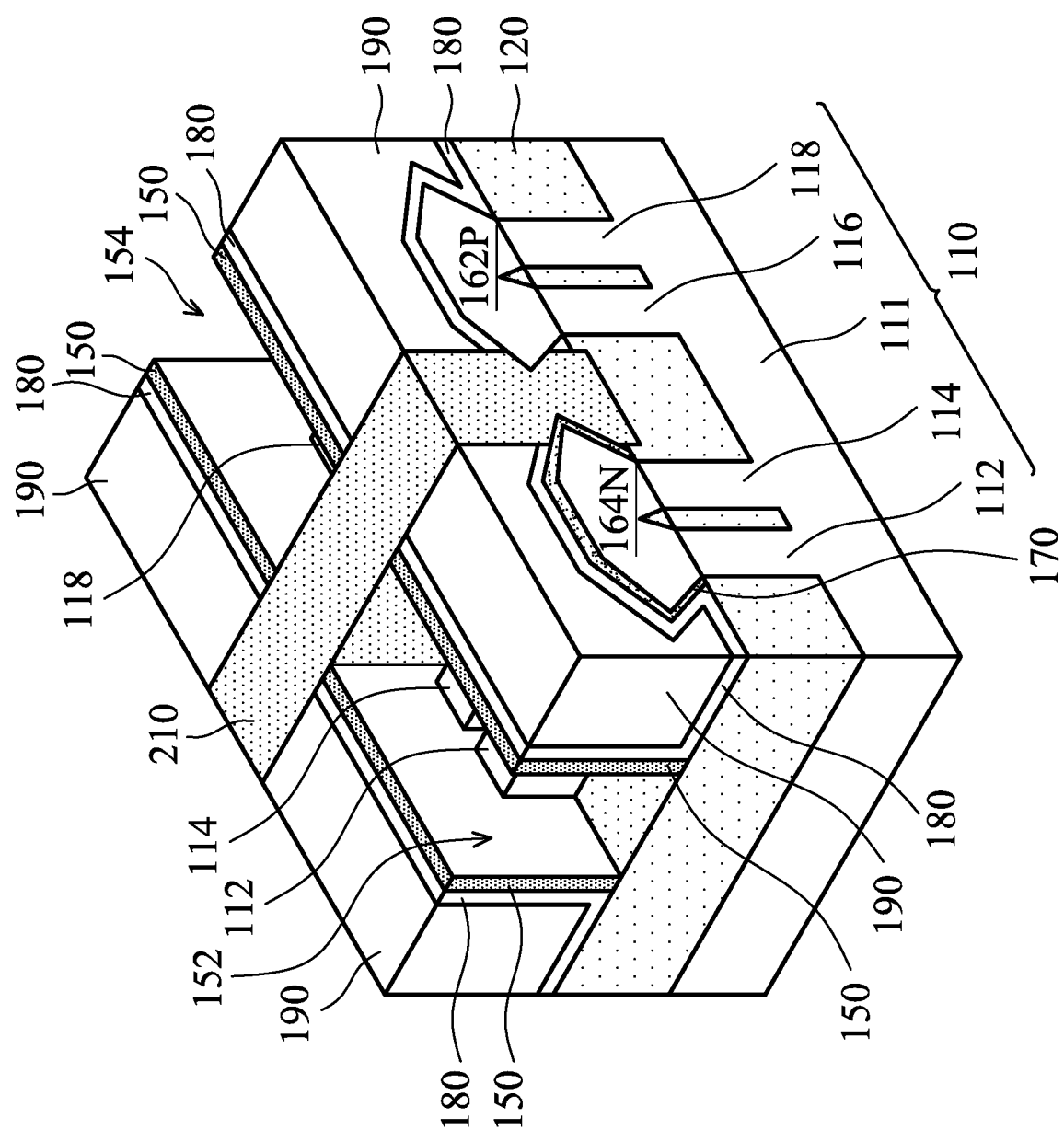
Figure 1M:
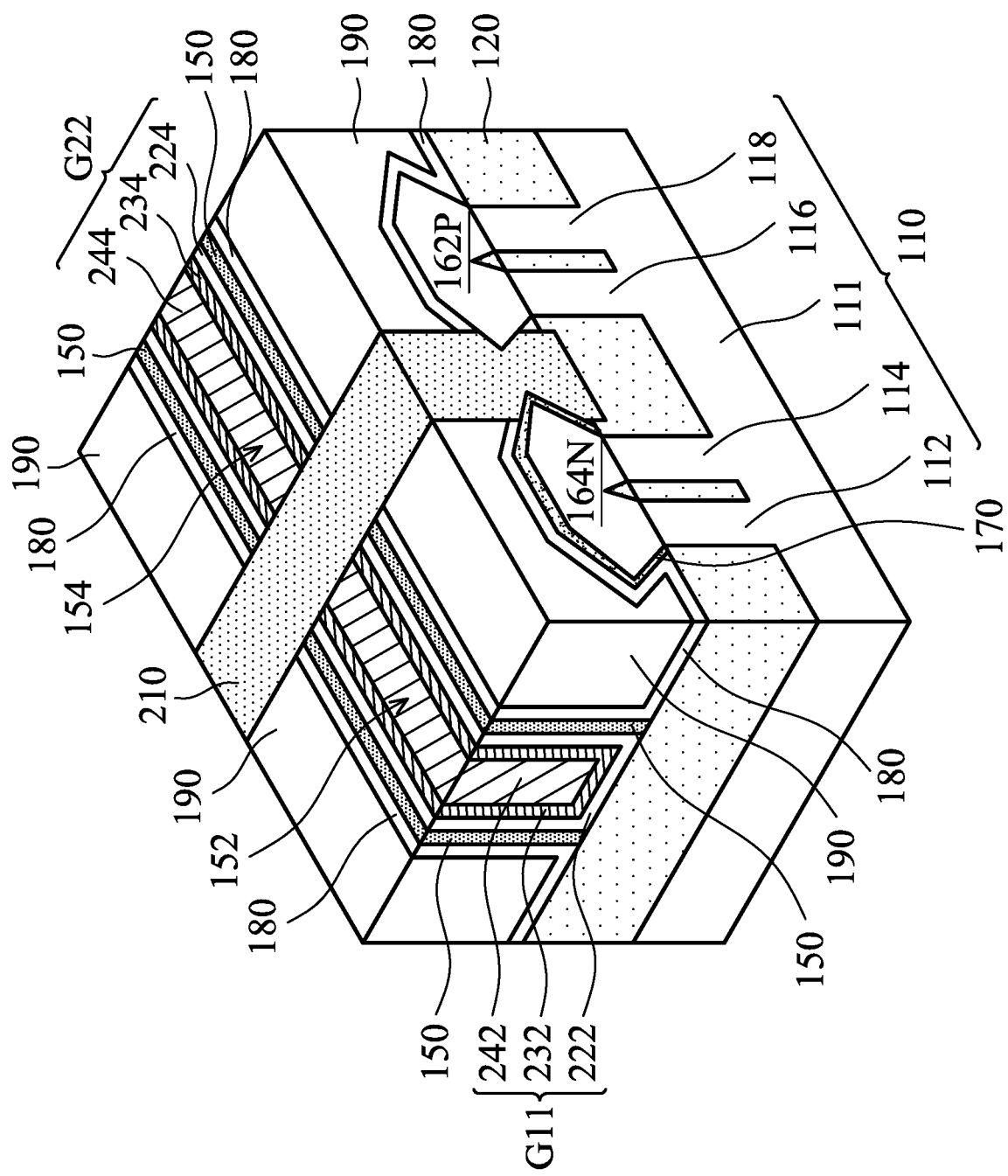
Figure 1N:
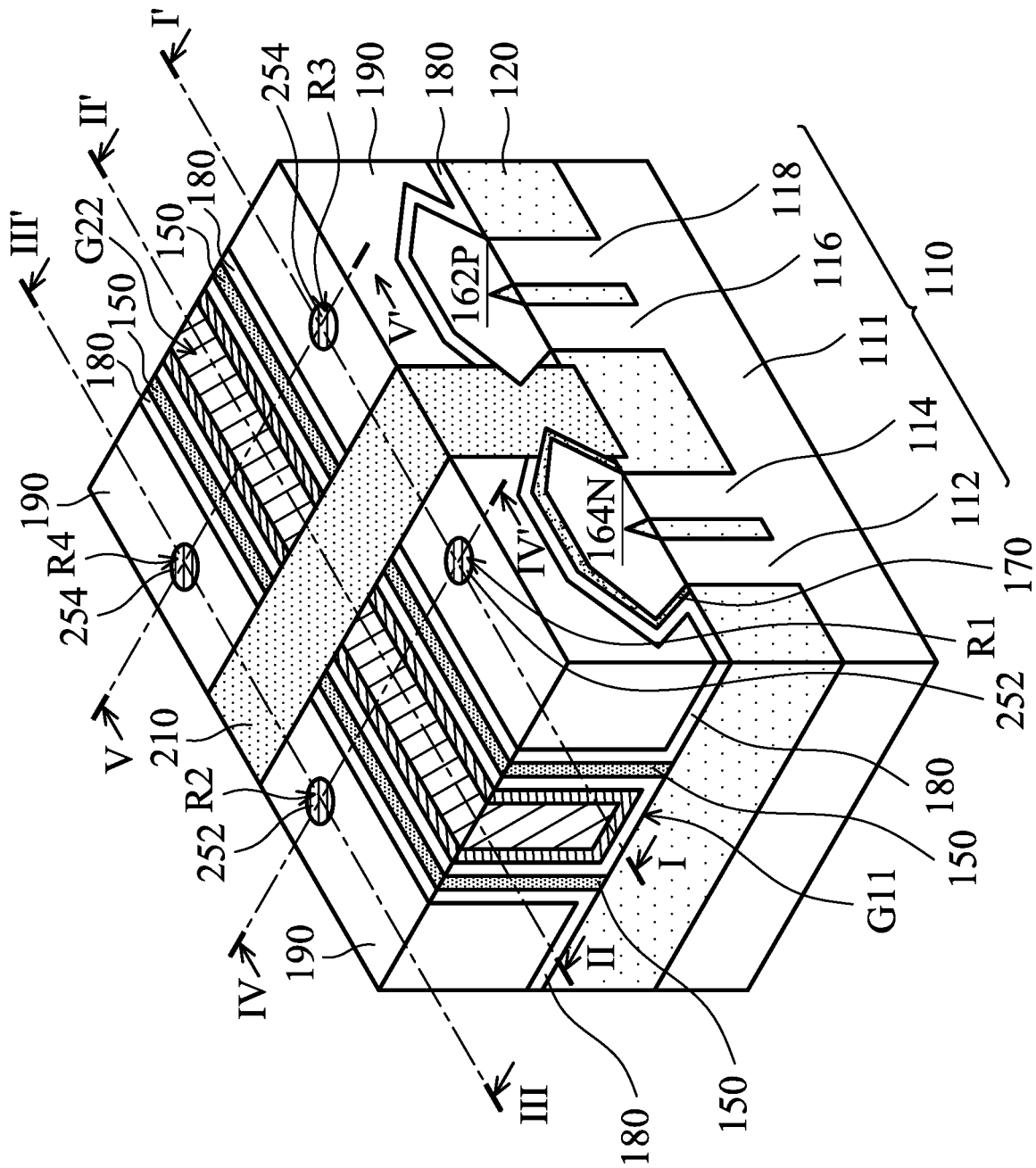
Figures 1, 1N:
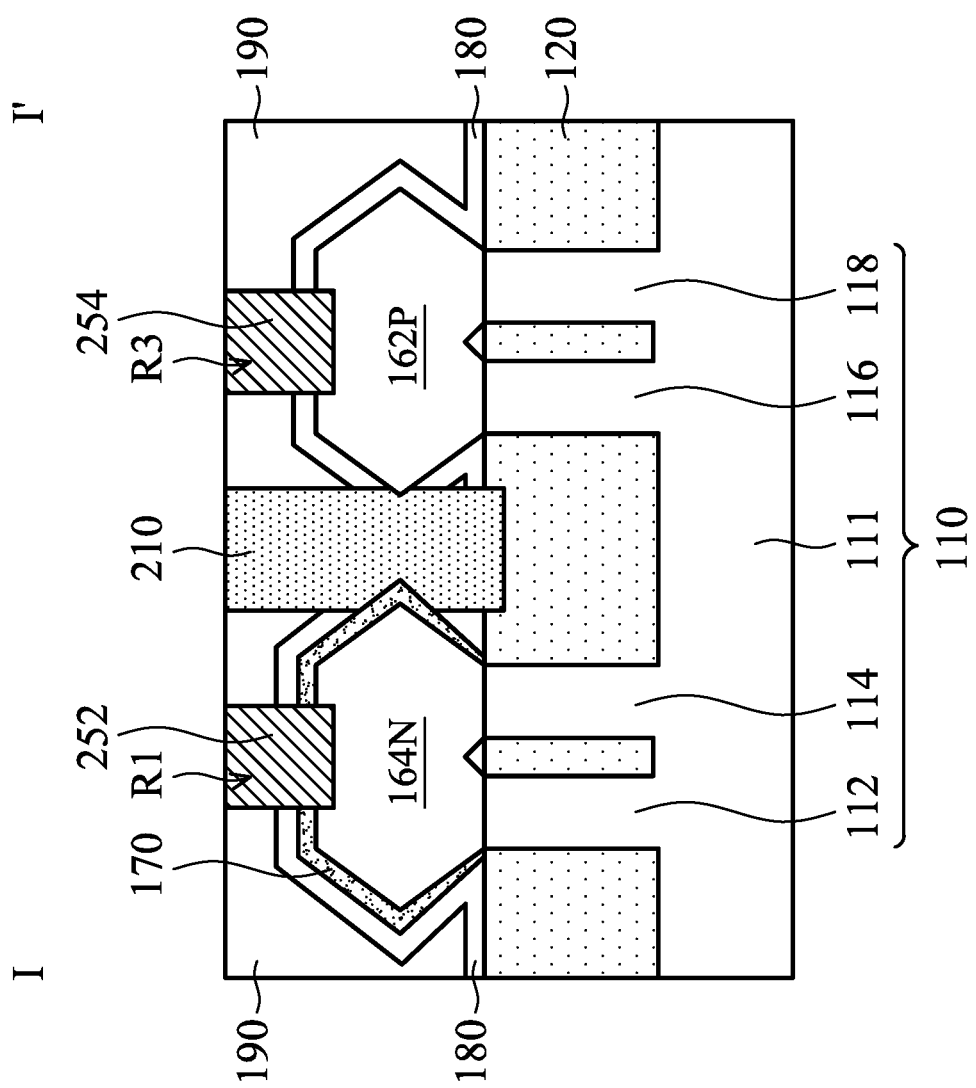

FIGS. 1A-1N are perspective views of various stages of a process for forming a semiconductor device structure, in accordance with some embodiments. As shown in FIG. 1A, a substrate 110 is provided, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

As shown in FIG. 1A, the substrate 110 has a base 111 and fin structures 112, 114, 116, and 118, in accordance with some embodiments. The fin structures 112, 114, 116, and 118 are over the base 111, in accordance with some embodiments. The fin structures 112, 114, 116, and 118 are spaced apart from each other by trenches P1, P2, and P3 therebetween, in accordance with some embodiments.

In some embodiments, a distance D1 between the fin structures 112 and 114 is less than a distance D2 between the fin structures 114 and 116. In some embodiments, a distance D3 between the fin structures 112, 114, 116, and 118 is less than the distance D2.

As shown in FIG. 1B, an isolation layer 120 is formed over the base 111, in accordance with some embodiments. Each of the fin structure 112, 114, 116, or 118 is partially in the isolation layer 120, in accordance with some embodiments. The isolation layer 120 includes oxide (such as silicon oxide), in accordance with some embodiments. The isolation layer 120 is formed by a chemical vapor deposition (CVD) process and an etching back process, in accordance with some embodiments.

As shown in FIG. 1B, a gate dielectric layer 130 and a gate electrode 140 are formed over the fin structures 112, 114, 116, and 118 and the isolation layer 120, in accordance with some embodiments. The gate electrode 140 is formed over the gate dielectric layer 130, in accordance with some embodiments.

The gate dielectric layer 130 is positioned between the gate electrode 140 and the fin structures 112, 114, 116, and 118, in accordance with some embodiments. The gate dielectric layer 130 is also positioned between the gate electrode 140 and the isolation layer 120, in accordance with some embodiments. The gate electrode 140 and the gate dielectric layer 130 together form a gate structure G, in accordance with some embodiments. Portions of the gate structure G are in the trenches P1, P2, and P3, in accordance with some embodiments.

The gate dielectric layer 130 is made of silicon oxide, in accordance with some embodiments. The gate dielectric layer 130 is formed using a chemical vapor deposition process (CVD process) and an etching process, in accordance with some embodiments. The gate electrode 140 is made of polysilicon, in accordance with some embodiments. The gate electrode 140 is formed using a chemical vapor deposition process and an etching process, in accordance with some embodiments.

As shown in FIG. 1B, a spacer layer 150 is formed over sidewalls S of the gate structure G, in accordance with some embodiments. The spacer layer 150 surrounds the gate structure G, in accordance with some embodiments. The spacer layer 150 is positioned over the fin structures 112, 114, 116, and 118 and the isolation layer 120, in accordance with some embodiments.

The spacer layer 150 includes insulating materials, such as silicon oxide, silicon nitride, silicon oxynitride, or silicon carbide, in accordance with some embodiments. The formation of the spacer layer 150 includes a deposition process and an anisotropic etching process, in accordance with some embodiments.

As shown in FIG. 1C, a mask layer M1 is formed over the isolation layer 120 to cover the fin structures 112 and 114, in accordance with some embodiments. The mask layer M1 is made of a dielectric material, in accordance with some embodiments. The dielectric material may include silicon nitride, silicon oxynitride, silicon carbide, another suitable dielectric material, or a combination thereof.

In some embodiments, a mask material layer is deposited over the isolation layer 120, the fin structures 112, 114, 116, and 118, and the gate structure G. The mask material layer may be deposited by using a chemical vapor deposition (CVD) process, a physical vapor deposition (PVD) process, a spin-on process, another applicable process, or a combination thereof. Afterwards, the mask material layer is partially removed by using a photolithography process and an etching process. For example, a patterned photoresist layer (not shown) is formed on the mask material layer. The portion of the mask material layer not covered by the photoresist layer is etched. As a result, the mask layer M1 is formed.

Thereafter, as shown in FIG. 1C, portions of the fin structures 116 and 118, which are outside of the isolation layer 120 and not covered by the gate structure G and the spacer layer 150, are removed, in accordance with some embodiments. The removal process includes an etching process, in accordance with some embodiments.

As shown in FIG. 1D, stressors 162P are formed on the fin structures 116 and 118, in accordance with some embodiments. The stressors 162P are in direct contact with the fin structures 116 and 118, in accordance with some embodiments. The stressors 162P are positioned on two opposite sides of the gate structure G, in accordance with some embodiments. In some embodiments, one of the stressors 162P is a source structure and the other stressor 162P is a drain structure.

The source structure and the drain structure are made of a P-type conductivity material, in accordance with some embodiments. The P-type conductivity material includes silicon germanium (SiGe) or another suitable P-type conductivity material. The stressors 162P are formed using an epitaxial process, in accordance with some embodiments. The stressors 162P are doped with the Group IIIA element, in accordance with some embodiments. The Group IIIA element includes boron or another suitable material.

As shown in FIG. 1E, the mask layer M1 is removed, in accordance with some embodiments. The removal process includes an etching process or another suitable process. As shown in FIG. 1E, after the removal process, a mask layer M2 is formed over the isolation layer 120 to cover the fin structures 116 and 118 and the stressors 162P, in accordance with some embodiments. The mask layer M2 is made of a dielectric material, in accordance with some embodiments. The dielectric material may include silicon nitride, silicon oxynitride, silicon carbide, another suitable dielectric material, or a combination thereof.

In some embodiments, a mask material layer is deposited over the isolation layer 120, the fin structures 112, 114, 116, and 118, the gate structure G, and the stressors 162P. The mask material layer may be deposited by using a chemical vapor deposition (CVD) process, a physical vapor deposition (PVD) process, a spin-on process, another applicable process, or a combination thereof. Afterwards, the mask material layer is partially removed by using a photolithography process and an etching process. For example, a patterned photoresist layer (not shown) is formed on the mask material layer. The portion of the mask material layer not covered by the photoresist layer is etched. As a result, the mask layer M2 is formed.

Thereafter, as shown in FIG. 1E, portions of the fin structures 112 and 114, which are outside of the isolation layer 120 and not covered by the gate structure G and the spacer layer 150, are removed, in accordance with some embodiments. The removal process includes an etching process, in accordance with some embodiments.

As shown in FIG. 1F, stressors 164N are formed on the fin structures 112 and 114, in accordance with some embodiments. The stressors 164N are in direct contact with the fin structures 112 and 114, in accordance with some embodiments. The stressors 164N are positioned on two opposite sides of the gate structure G, in accordance with some embodiments. In some embodiments, one of the stressors 164N is a source structure and the other stressor 164N is a drain structure. Each stressor 164N has a top surface 164a, sidewalls 164c, and a bottom surface 164b, in accordance with some embodiments.

The stressors 164N are made of a N-type conductivity material, in accordance with some embodiments. The N-type conductivity material includes silicon phosphorus (SiP) or another suitable N-type conductivity material. The stressors 164N are formed using an epitaxial process, in accordance with some embodiments.

The stressors 164N are doped with the Group VA element, in accordance with some embodiments. The Group VA element includes phosphor (P), antimony (Sb), or another suitable Group VA material. In some embodiments, a concentration of the Group VA element (e.g. phosphor) ranges from about 3E21 atoms/cm$^3$ to about 7E21 atoms/cm$^3$. As shown in FIG. 1F, the mask layer M2 is removed, in accordance with some embodiments. The removal process includes an etching process or another suitable process.

As shown in FIG. 1G, a cap layer 170 is formed over the stressors 164N, in accordance with some embodiments. The cap layer 170 conformally covers the stressors 164N, in accordance with some embodiments. The cap layer 170 is in direct contact with the stressors 164N and the isolation layer 120, in accordance with some embodiments.

The cap layer 170 is made of a P-type conductivity material, such as silicon germanium (SiGe) or the like, in accordance with some embodiments. The cap layer 170 is doped with the Group IIIA element, which is the same as the Group IIIA element doped in the stressors 162P, in accordance with some embodiments. The Group IIIA element includes boron or another suitable material.

In some embodiments, a first average concentration of the Group IIIA (e.g. boron) element in the cap layer 170 is less than a second average concentration of the Group IIIA element in the stressors 162P. The first average concentration ranges from about 4E20 atoms/cm$^3$ to about 9E20 atoms/cm$^3$, in accordance with some embodiments.

The second average concentration ranges from about 1E21 atoms/cm$^3$ to about 9E21 atoms/cm$^3$, in accordance with some embodiments. The first average concentration is less than the concentration of the Group VA element doped in the stressors 164N, in accordance with some embodiments.

The cap layer 170 and the stressors 164N are made of different materials, in accordance with some embodiments. The etching rate of the cap layer 170 is less than the etching rate of the stressors 164N during the subsequent etching process, in accordance with some embodiments. Therefore, the cap layer 170 prevents the stressor 164N thereunder from damage during the subsequent etching process, in accordance with some embodiments.

In some embodiments, an average thickness of the cap layer 170 ranges from about 2 nm to about 6 nm. In some embodiments, the average thickness of the cap layer 170 ranges from about 2 nm to about 4 nm. In some embodiments, a thickness T1 of the cap layer 170 over (or adjacent to) top surfaces 164a of the stressors 164N is greater than a thickness T2 of the cap layer 170 adjacent to bottom surfaces 164b of the stressors 164N. The cap layer 170 is formed using an epitaxial process, in accordance with some embodiments.

In some embodiments, a total width W1 of the cap layer 170 and the stressor 164N is greater than a width W2 of the stressor 162P. The cap layer 170 covers the top surfaces 164a and the sidewalls 164c of the stressors 164N, in accordance with some embodiments. The cap layer 170 does not cover the bottom surfaces 164b of the stressors 164N, in accordance with some embodiments.

As shown in FIG. 1H, an etching stop layer 180 is deposited over the gate structure G, the spacer layer 150, the isolation layer 120, the cap layer 170, and the stressors 162P, in accordance with some embodiments. The etching stop layer 180 is in direct contact with the gate structure G, the spacer layer 150, the isolation layer 120, the cap layer 170, and the stressors 162P, in accordance with some embodiments.

The cap layer 170 is between the etching stop layer 180 and the stressors 164N to separate the etching stop layer 180 from the stressors 164N, in accordance with some embodiments. In some embodiments, the average thickness of the cap layer 170 is less than the average thickness of the etching stop layer 180.

As shown in FIG. 1H, a dielectric layer 190 is formed over the etching stop layer 180, in accordance with some embodiments. The dielectric layer 190 includes oxide (such as silicon oxide), in accordance with some embodiments. The dielectric layer 190 is formed by a chemical vapor deposition (CVD) process, in accordance with some embodiments.

As shown in FIG. 1I, a planarization process is then performed on the dielectric layer 190 until a top surface 142 of the gate electrode 140 is exposed, in accordance with some embodiments. The planarization process includes a chemical mechanical polishing (CMP) process, in accordance with some embodiments.

As shown in FIG. 1J, portions of the isolation layer 120, the gate dielectric layer 130, the gate electrode 140, the spacer layer 150, the etching stop layer 180, and the dielectric layer 190 between the fin structures 114 and 116 are removed, in accordance with some embodiments.

The removal process forms a trench R passing through the gate dielectric layer 130, the gate electrode 140, the spacer layer 150, the etching stop layer 180, and the dielectric layer 190 between the fin structures 114 and 116, in accordance with some embodiments. The trench R penetrates into the isolation layer 120 between the fin structures 114 and 116, in accordance with some embodiments.

The gate structure G is divided into a first gate structure G1 and a second gate structure G2 by the trench R, in accordance with some embodiments. The first gate structure G1 is over the fin structures 112 and 114, in accordance with some embodiments. The second gate structure G2 is over the fin structures 116 and 118, in accordance with some embodiments.

The removal process includes a photolithography process and an etching process, in accordance with some embodiments. The etching process includes a dry etching process, in accordance with some embodiments. The dry etching process uses a process gas including $Cl_2$ and/or $SiCl_4$, in accordance with some embodiments.

FIG. 1K-1 is a cross-sectional view illustrating the semiconductor device structure along a sectional line I-I' in FIG. 1K, in accordance with some embodiments. As shown in FIGS. 1K and 1K-1, an isolation structure 210 is formed in the trench R, in accordance with some embodiments. The isolation structure 210 is between the gate structures G1 and G2 and between the stressors 164N and 162P, in accordance with some embodiments. The isolation structure 210 passes through the dielectric layer 190, in accordance with some embodiments.

The isolation structure 210 is in direct contact with the gate structures G1 and G2 (i.e. the gate electrode 140 and the gate dielectric layer 130), the cap layer 170, the stressors 162P, the etching stop layer 180, the spacer layer 150, the dielectric layer 190, and the isolation layer 120, in accordance with some embodiments.

The cap layer 170 and the stressors 164N extend into the isolation structure 210, in accordance with some embodiments. The stressors 162P extend into the isolation structure 210, in accordance with some embodiments. The cap layer 170 separates the isolation structure 210 from the stressors 164N, in accordance with some embodiments. The cap layer 170 is in direct contact with the isolation structure 210, in accordance with some embodiments.

The isolation structure 210 is made of an insulating material, such as silicon oxide, silicon nitride, silicon oxynitride, silicon carbide, or the like, in accordance with some embodiments. In some embodiments, the isolation structure 210 and the dielectric layer 190 are made of different materials. In some other embodiments, the isolation structure 210 and the dielectric layer 190 are made of the same material. The isolation structure 210 is formed using a deposition process and a planarization process, in accordance with some embodiments.

As shown in FIG. 1L, the gate structures G1 and G2 are removed, in accordance with some embodiments. The removal process includes a wet etching process, in accordance with some embodiments. After the removal process, trenches 152 and 154 are formed in the spacer layer 150, in accordance with some embodiments. The trench 152 exposes portions of the fin structures 112 and 114, in accordance with some embodiments. The trench 154 exposes portions of the fin structures 116 and 118, in accordance with some embodiments.

As shown in FIG. 1M, gate dielectric layers 222 and 224 are respectively formed in the trenches 152 and 154 to cover bottom surfaces of the trenches 152 and 154, in accordance with some embodiments. The gate dielectric layers 222 and 224 are made of silicon oxide, silicon nitride, silicon oxynitride, dielectric material with high dielectric constant (high-K), another suitable dielectric material, or a combination thereof.

Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

Thereafter, as shown in FIG. 1M, work function metal layers 232 and 234 are respectively deposited over the gate dielectric layers 222 and 224, in accordance with some embodiments. The work function metal layers 232 and 234 provide a desired work function for transistors to enhance device performance including improved threshold voltage.

In the embodiments of forming an NMOS transistor, the work function metal layer 232 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

In the embodiments of forming a PMOS transistor, the work function metal layer 234 can be a p-type metal capable of providing a work function value suitable for the device, such as equal to or greater than about 4.8 eV. The p-type metal may be made of metal, metal carbide, metal nitride, other suitable materials, or a combination thereof.

For example, the p-type metal is made of titanium, titanium nitride, other suitable materials, or a combination thereof. The work function metal layers 232 and 234 are formed using a deposition process and a planarization process, in accordance with some embodiments. The deposition process includes a PVD process, CVD process, ALD process, plating process, another suitable method, or a combination thereof.

In some embodiments, the work function metal layers 232 and 234 are made of different materials. The work function metal layers 232 and 234 are formed individually, in accordance with some embodiments. For example, during the formation of the work function metal layer 232, the trench 154 is covered by a first mask layer (not shown), and during the formation of the work function metal layer 234, the trench 152 is covered by a second mask layer (not shown).

In some other embodiments, the work function metal layers 232 and 234 are made the same material. The work function metal layers 232 and 234 are formed in the same deposition process, in accordance with some embodiments.

Afterwards, as shown in FIG. 1M, gate electrode layers 242 and 244 (also called metal gate electrode layers) are respectively deposited over the work function metal layers 232 and 234 to fill the trenches 152 and 154, in accordance with some embodiments. The gate electrode layers 242 and 244 are made of a suitable metal material, such as aluminum, tungsten, gold, platinum, cobalt, another suitable metal, an alloy thereof, or a combination thereof, in accordance with some embodiments.

The gate electrode layer 242, the work function metal layer 232, and the gate dielectric layer 222 together form a gate structure G11, in accordance with some embodiments. The gate electrode layer 244, the work function metal layer 234, and the gate dielectric layer 224 together form a gate structure G22, in accordance with some embodiments.

Figures 1, 1N, 2:
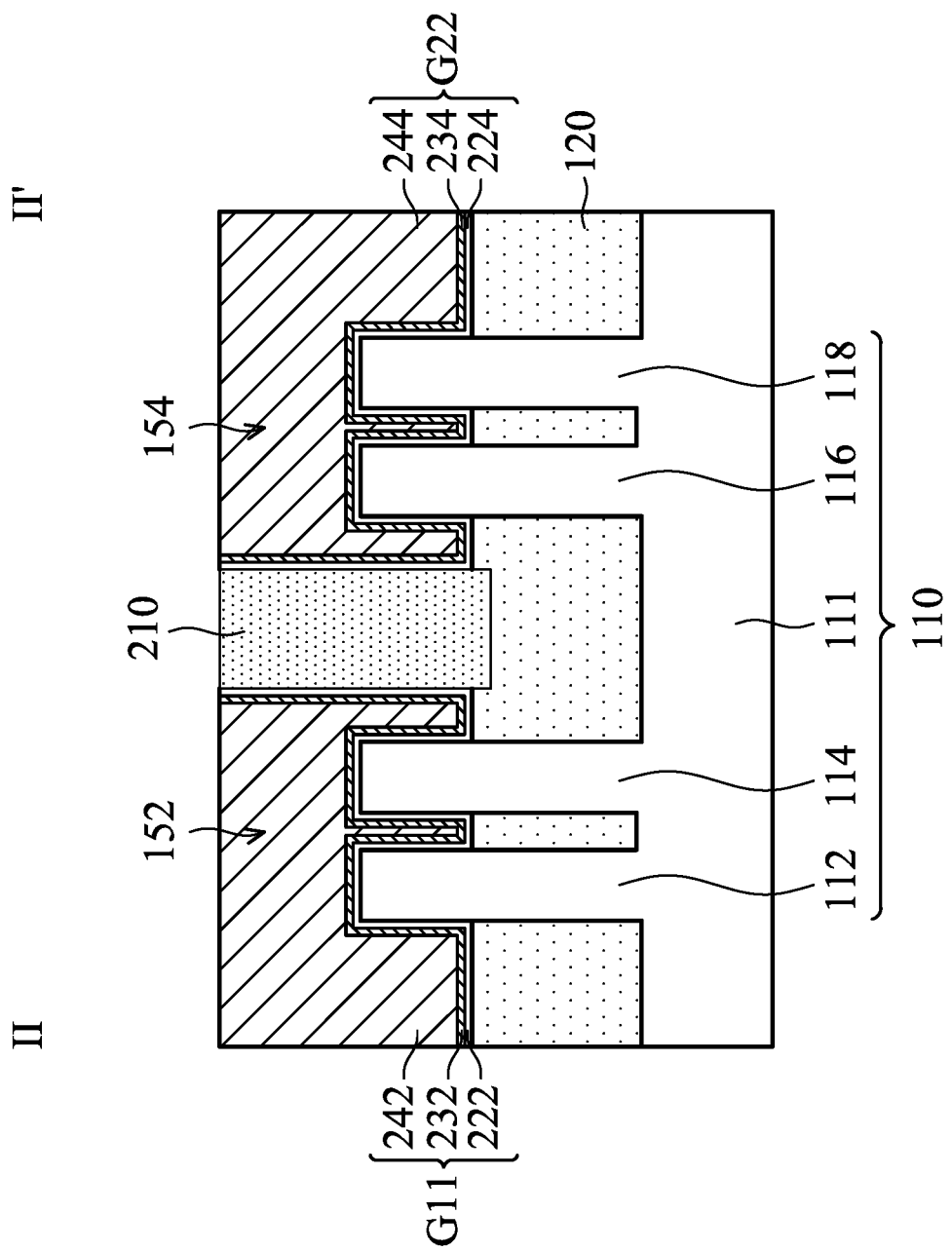
Figures 1, 1N, 2, 3:
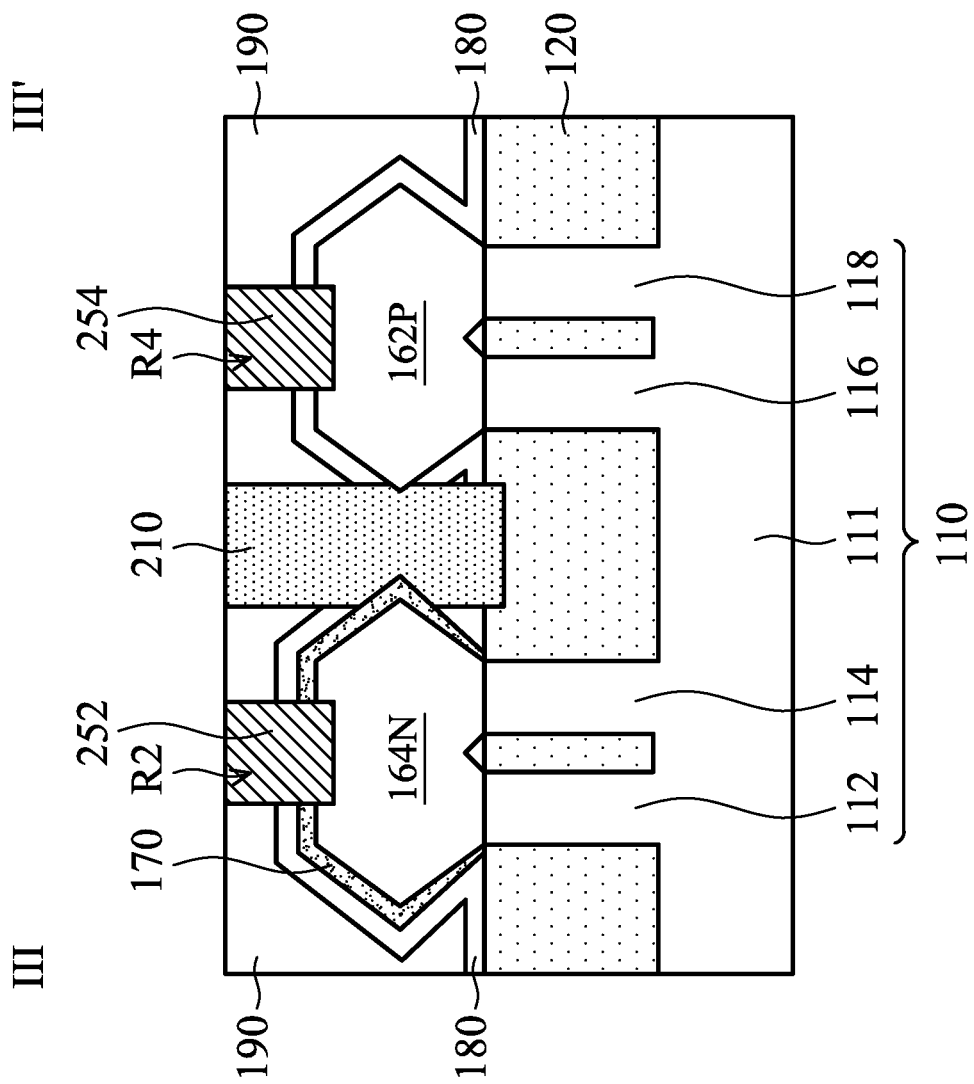
Figures 1, 1N, 2, 3, 4:
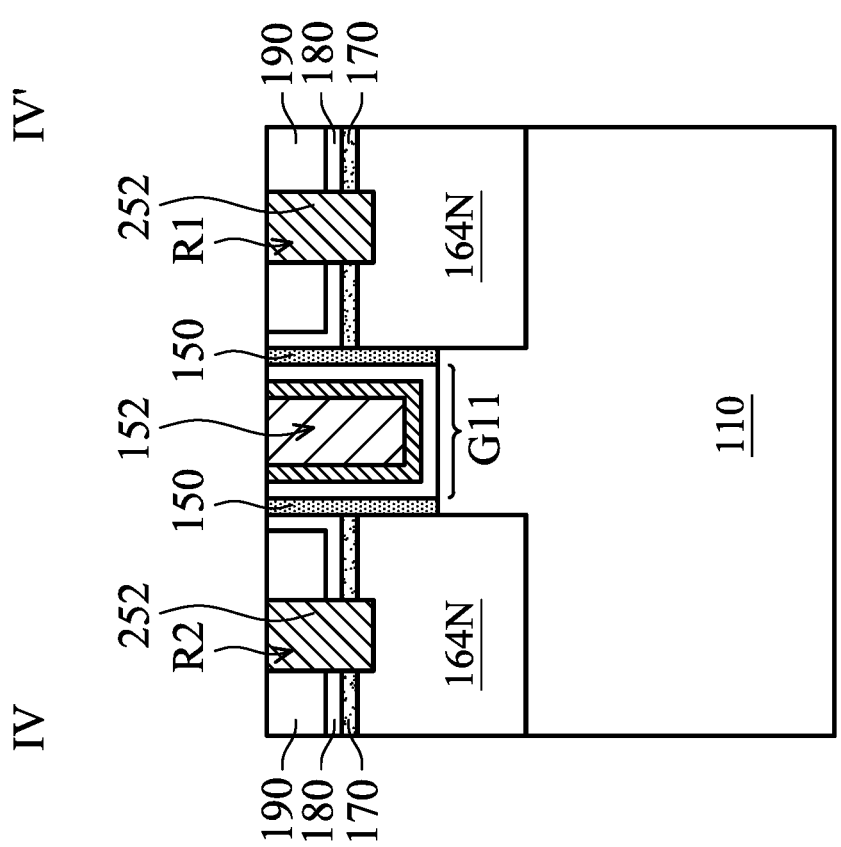
Figures 1, 1N, 2, 3, 4, 5:
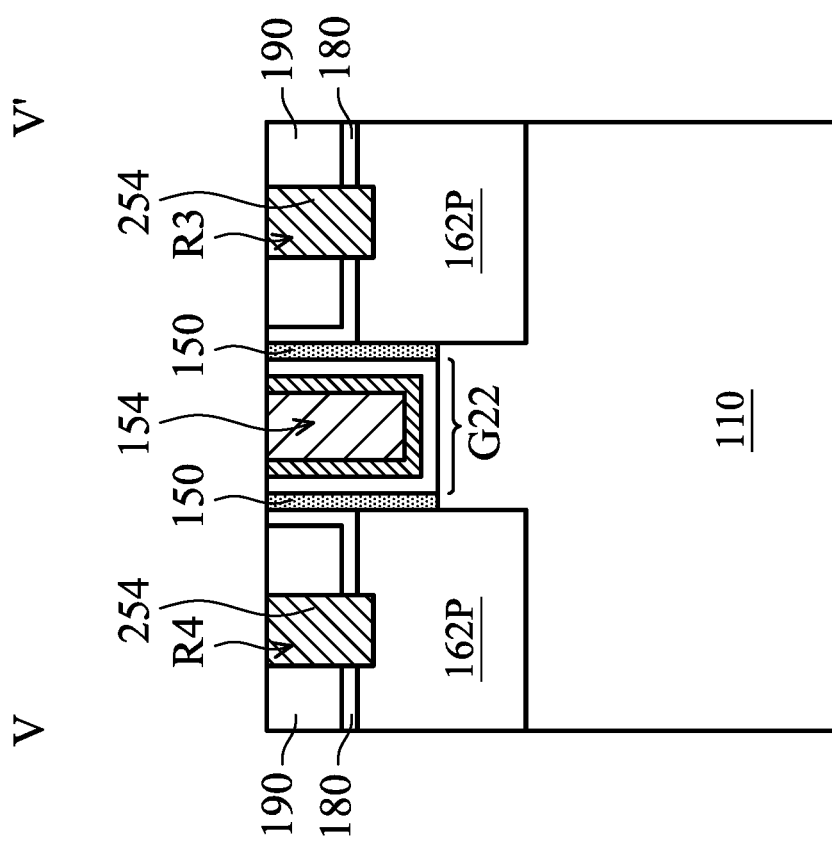

FIG. 1N-1 is a cross-sectional view illustrating the semiconductor device structure along a sectional line I-I' in FIG. 1N, in accordance with some embodiments. FIG. 1N-2 is a cross-sectional view illustrating the semiconductor device structure along a sectional line II-II' in FIG. 1N, in accordance with some embodiments. FIG. 1N-3 is a cross-sectional view illustrating the semiconductor device structure along a sectional line III-III' in FIG. 1N, in accordance with some embodiments. FIG. 1N-4 is a cross-sectional view illustrating the semiconductor device structure along a sectional line IV-IV' in FIG. 1N, in accordance with some embodiments. FIG. 1N-5 is a cross-sectional view illustrating the semiconductor device structure along a sectional line V-V' in FIG. 1N, in accordance with some embodiments.

As shown in FIGS. 1N and 1N-1 to 1N-4, through holes R1 and R2 are formed in the dielectric layer 190, the etching stop layer 180, and the cap layer 170, in accordance with some embodiments. The through holes R1 and R2 pass through the dielectric layer 190, the etching stop layer 180, and the cap layer 170 and extend into the stressors 164N, in accordance with some embodiments.

As shown in FIGS. 1N and 1N-5, through holes R3 and R4 are formed in the dielectric layer 190 and the etching stop layer 180, in accordance with some embodiments. The through holes R3 and R4 pass through the dielectric layer 190 and the etching stop layer 180 and extend into the stressors 162P, in accordance with some embodiments.

The through holes R1, R2, R3, and R4 are formed using an etching process, in accordance with some embodiments. Since the cap layer 170 is thin (i.e. less than or equal to 6 nm), the etching process removes the cap layer 170 easily.

Thereafter, as shown in FIGS. 1N and 1N-1 to 1N-5, contact plugs 252 are formed in the through holes R1 and R2, and contact plugs 254 are formed in the through holes R3 and R4, in accordance with some embodiments. The contact plugs 252 pass through the dielectric layer 190, the etching stop layer 180, and the cap layer 170 and penetrate into the stressors 164N, in accordance with some embodiments. Each contact plug 252 is electrically connected to the stressor 164N thereunder, in accordance with some embodiments.

The contact plugs 254 pass through the dielectric layer 190 and the etching stop layer 180 and penetrate into the stressors 162P, in accordance with some embodiments. Each contact plug 254 is electrically connected to the stressor 162P thereunder, in accordance with some embodiments. The contact plugs 252 and 254 are made of a suitable conductive material, such as a metal material (e.g., aluminum, tungsten, gold, platinum, cobalt, another suitable metal, an alloy thereof, or a combination thereof), in accordance with some embodiments.

In accordance with some embodiments, semiconductor device structures and methods for forming the same are provided. The methods (for forming the semiconductor device structure) form a cap layer over a source structure and a drain structure (or stressors) with N-type conductivity to prevent the source structure and the drain structure from damage during subsequent etching processes. The cap layer is doped with a Group IIIA element.

In accordance with some embodiments, a semiconductor device structure is provided. The semiconductor device structure includes a substrate having a base and a first fin structure over the base. The semiconductor device structure includes an isolation layer over the base. The first fin structure is partially in the isolation layer. The semiconductor device structure includes a first gate structure over and across the first fin structure. The semiconductor device structure includes a first source structure and a first drain structure on the first fin structure and on two opposite sides of the first gate structure. The first source structure and the first drain structure are made of an N-type conductivity material. The semiconductor device structure includes a cap layer covering the first source structure and the first drain structure. The cap layer is doped with a Group IIIA element.

In accordance with some embodiments, a semiconductor device structure is provided. The semiconductor device structure includes a substrate having a base and a first fin structure over the base. The semiconductor device structure includes an isolation layer over the base. The first fin structure is partially in the isolation layer. The semiconductor device structure includes a first gate structure over and across the first fin structure. The semiconductor device structure includes a first stressor and a second stressor on the first fin structure and on two opposite sides of the first gate structure. The first stressor and the second stressor are made of an N-type conductivity material. The semiconductor device structure includes a cap layer covering a first top surface and a first sidewall of the first stressor and a second top surface and a second sidewall of the second stressor. The cap layer does not cover a first bottom surface of the first stressor and a second bottom surface of the second stressor, and the cap layer is doped with a Group IIIA element.

In accordance with some embodiments, a method for forming a semiconductor device structure is provided. The method includes providing a substrate having a base, a first fin structure, and a second fin structure. The first fin structure and the second fin structure are over the base. The method includes forming an isolation layer over the base. The first fin structure and the second fin structure are partially in the isolation layer. The method includes forming a gate structure over and across the first fin structure and the second fin structure. The method includes forming a source structure and a drain structure on the first fin structure and on two opposite sides of the gate structure. The source structure and the drain structure are made of an N-type conductivity material. The method includes forming a cap layer over the source structure and the drain structure. The cap layer is doped with a Group IIIA element. The method includes forming a dielectric layer over the isolation layer, the source structure, and the drain structure. The method includes removing portions of the gate structure and the dielectric layer between the first fin structure and the second fin structure to form a trench in the gate structure and the dielectric layer. The gate structure is divided into a first gate structure and a second gate structure respectively over the first fin structure and the second fin structure by the trench. The method includes forming an isolation structure in the trench. The isolation structure is between the first gate structure and the second gate structure and between the cap layer and the second fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate having a base and a first fin structure over the base;
   an isolation layer over the base, wherein the first fin structure is partially in the isolation layer;
   a first gate structure over the first fin structure;
   a first source structure and a first drain structure on the first fin structure and on two opposite sides of the first gate structure, wherein the first source structure and the first drain structure are made of an N-type conductivity material; and
   a cap layer covering the first source structure and the first drain structure, wherein the cap layer is doped with a Group IIIA element, and wherein the cap layer adjacent to a top surface of the first source structure is thicker than the cap layer adjacent to a bottom surface of the first source structure.

2. The semiconductor device structure as claimed in claim 1, wherein the cap layer is made of silicon germanium.

3. The semiconductor device structure as claimed in claim 1, wherein the Group IIIA element is boron.

4. The semiconductor device structure as claimed in claim 1, wherein the N-type conductivity material is silicon phosphorus.

5. The semiconductor device structure as claimed in claim 1, wherein the substrate further has a second fin structure over the base, and the semiconductor device structure further comprises:
   a second gate structure over and across the second fin structure; and
   a second source structure and a second drain structure on the second fin structure and on two opposite sides of the second gate structure, wherein the second source structure and the second drain structure are made of a P-type conductivity material, and the second source structure and the second drain structure are doped with the Group IIIA element.

6. The semiconductor device structure as claimed in claim 5, further comprising:
a dielectric layer over the isolation layer, the first source structure, the first drain structure, the second source structure, and the second drain structure, wherein the first gate structure and the second gate structure are embedded in the dielectric layer; and
an isolation structure between the first gate structure and the second gate structure, between the first source structure and the second source structure, and between the first drain structure and the second drain structure, wherein the isolation structure passes through the dielectric layer.

7. The semiconductor device structure as claimed in claim 6, wherein the isolation structure is in direct contact with the first gate structure, the second gate structure, the cap layer, the dielectric layer, and the isolation layer.

8. The semiconductor device structure as claimed in claim 6, wherein the cap layer extends into the isolation structure, and the cap layer separates the isolation structure from the first source structure and the first drain structure.

9. The semiconductor device structure as claimed in claim 6, wherein the cap layer is in direct contact with the first source structure, the first drain structure, the isolation layer, and the isolation structure.

10. The semiconductor device structure as claimed in claim 7, wherein the isolation structure is further in direct contact with the second source structure and the second drain structure.

11. The semiconductor device structure as claimed in claim 5, wherein a first average concentration of the Group IIIA element in the cap layer is less than a second average concentration of the Group IIIA element in the second source structure and the second drain structure.

12. The semiconductor device structure as claimed in claim 11, wherein the first source structure and the first drain structure are doped with a Group VA element, and the first average concentration of the Group IIIA element in the cap layer is less than a third average concentration of the Group VA element in the first source structure and the first drain structure.

13. The semiconductor device structure as claimed in claim 1, further comprising:
a contact plug passing through the cap layer and penetrating into the first source structure to be electrically connected to the first source structure.

14. A semiconductor device structure, comprising:
a substrate having a base and a first fin structure over the base;
an isolation layer over the base, wherein the first fin structure is partially in the isolation layer;
a first gate structure extending across the first fin structure;
a first stressor and a second stressor on the first fin structure and on two opposite sides of the first gate structure, wherein the first stressor and the second stressor are made of an N-type conductivity material;
a cap layer covering a first top surface and a first sidewall of the first stressor and a second top surface and a second sidewall of the second stressor, wherein the cap layer is doped with a Group IIIA element; and
an etching stop layer covering the cap layer, the first stressor, and the second stressor, wherein the cap layer separates the etching stop layer from the first stressor and the second stressor.

15. The semiconductor device structure as claimed in claim 14, wherein the substrate further has a second fin structure over the base, and the semiconductor device structure further comprises:
a second gate structure over and across the second fin structure; and
a third stressor and a fourth stressor on the second fin structure and on two opposite sides of the second gate structure, wherein the third stressor and the fourth stressor are made of a P-type conductivity material, and the third stressor and the fourth stressor are doped with the Group IIIA element;
a dielectric layer over the isolation layer, the first stressor, the second stressor, the third stressor, and the fourth stressor, wherein the first gate structure and the second gate structure are embedded in the dielectric layer; and
an isolation structure between the first gate structure and the second gate structure, between the first stressor and the third stressor, and between the second stressor and the fourth stressor, wherein the isolation structure passes through the dielectric layer.

16. The semiconductor device structure as claimed in claim 15, wherein the cap layer and the first stressor extend into the isolation structure.

17. The semiconductor device structure as claimed in claim 15, wherein the cap layer is in direct contact with the isolation structure.

18. The semiconductor device structure as claimed in claim 16, wherein the third stressor extends into the isolation structure.

19. The semiconductor device structure as claimed in claim 14, wherein the cap layer is thinner than the etching stop layer.

20. A semiconductor device structure, comprising:
a substrate having a base and a fin structure over the base;
an isolation layer over the base, wherein the fin structure is partially in the isolation layer;
a first gate structure over the fin structure;
a first source structure and a first drain structure on the fin structure and on two opposite sides of the first gate structure, wherein the first source structure and the first drain structure are made of an N-type conductivity material;
a cap layer covering the first source structure and the first drain structure, wherein the cap layer is doped with a Group IIIA element;
an etching stop layer over the isolation layer and the cap layer;
a dielectric layer over the etching stop layer; and
an isolation structure passing through the dielectric layer and the etching stop layer, wherein the cap layer extends into the isolation structure.

* * * * *